(12) United States Patent
Nakamura et al.

(10) Patent No.: US 8,673,396 B2
(45) Date of Patent: Mar. 18, 2014

(54) METHOD OF FORMING CONTINUOUS THIN FILM AND LINEAR GLASS SUBSTRATE WITH THIN FILM

(75) Inventors: Toshihiro Nakamura, Tokyo (JP); Sadayuki Toda, Tokyo (JP); Hisashi Koaizawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 713 days.

(21) Appl. No.: 12/232,183

(22) Filed: Sep. 11, 2008

(65) Prior Publication Data

US 2010/0021727 A1   Jan. 28, 2010

Related U.S. Application Data

(63) Continuation of application No. PCT/JP2007/055538, filed on Mar. 19, 2007.

(30) Foreign Application Priority Data

Mar. 20, 2006   (JP) .................................. 2006-076351

(51) Int. Cl.
| | |
|---|---|
| *C23C 16/24* | (2006.01) |
| *C23C 16/458* | (2006.01) |
| *C23C 16/54* | (2006.01) |
| *C23C 16/46* | (2006.01) |
| *H01L 21/02* | (2006.01) |

(52) U.S. Cl.
CPC ........... *C23C 16/4583* (2013.01); *C23C 16/545* (2013.01); *C23C 16/46* (2013.01); *H01L 21/02422* (2013.01); *H01L 21/02532* (2013.01)
USPC ............ 427/255.27; 427/255.393; 427/255.5; 427/398.1; 427/166

(58) Field of Classification Search
USPC ......................... 427/164–167, 255.11, 255.18
See application file for complete search history.

(56) References Cited

U.S. PATENT DOCUMENTS

4,180,618 A * 12/1979 Alpha et al. .................. 428/428
5,764,415 A * 6/1998 Nelson et al. ................. 359/584
(Continued)

FOREIGN PATENT DOCUMENTS

| JP | 05218367 A | * 8/1993 |
|---|---|---|
| JP | 11-204794 | 7/1999 |

(Continued)

OTHER PUBLICATIONS

Kermani et al. Rapid Thermal Chemical Vapor Deposition of Polycrystralline Silicon from Dichlorosilane. Mat. Res. Soc. Symp. Proc. vol. 182. 1990. pp. 21-27.*

(Continued)

*Primary Examiner* — David Turocy
(74) *Attorney, Agent, or Firm* — Kubotera & Associates, LLC

(57) ABSTRACT

A method of continuously forming a thin film includes the step of: moving a glass substrate with a thin strip shape having a constant db/2(d+b), where d is a thickness thereof and b is a width thereof in a cross section thereof, within a range from 0.015 to 0.15 through a film depositing region in which a reaction gas is supplied and a temperature is controlled to be high so that the glass substrate is rapidly heated; and moving continuously the glass substrate, immediately after the film depositing region, to pass through a cooling region in which a temperature is lower than that of the film depositing region, so that the glass substrate is rapidly cooled and the thin film formed of a component of the reaction gas is formed on the glass substrate.

15 Claims, 4 Drawing Sheets

(56) References Cited

U.S. PATENT DOCUMENTS

| | | | |
|---|---|---|---|
| 5,789,040 A * | 8/1998 | Martinu et al. | 427/575 |
| 5,798,142 A * | 8/1998 | Soubeyrand | 427/255.18 |
| 5,863,337 A * | 1/1999 | Neuman et al. | 118/718 |
| 6,393,210 B1 * | 5/2002 | Wu | 392/416 |
| 2001/0041250 A1 | 11/2001 | Werkhoven et al. | |
| 2002/0160553 A1 | 10/2002 | Yamanaka et al. | |
| 2003/0032281 A1 | 2/2003 | Werkhoven et al. | |
| 2003/0129826 A1 | 7/2003 | Werkhoven et al. | |
| 2004/0020761 A1 * | 2/2004 | Thomsen et al. | 204/192.12 |
| 2006/0105103 A1 * | 5/2006 | Hartig | 427/209 |

FOREIGN PATENT DOCUMENTS

| | | |
|---|---|---|
| JP | 2000-164519 A | 6/2000 |
| JP | 2000-349314 A | 12/2000 |
| TW | 490739 | 6/2002 |
| TW | 577174 | 2/2004 |
| WO | WO-2006-070527 | 7/2006 |

OTHER PUBLICATIONS

Office Action for Taiwanese patent application 096109499, Jul. 8, 2013, Taiwan Intellectual Property Office.

* cited by examiner (a)

31 Film depositing system
32 Furnace shell
33 Reaction tube
34 Infra-red generating device
35 Infra-red absorbing body (Susceptor)
36 Glass substrate
37 First region
38 Second region
39 Intermediate region (b)　　　　　(c)

METHOD OF FORMING CONTINUOUS THIN FILM AND LINEAR GLASS SUBSTRATE WITH THIN FILM

CROSS-REFERENCE TO RELATED APPLICATION

This is a continuation application of the prior PCT application PCT/JP2007/055538, filed on Mar. 19, 2007, which is claiming the priority to Japanese Patent Application No. 2006-076351, filed on Mar. 20, 2006.

FIELD OF THE INVENTION

The present invention relates to a fabricating technique to deposit various thin films on a glass substrate having a linear shape (referred to as a linear glass substrate) with a length in a longitudinal direction thereof sufficiently long relative to a width thereof. In particular, the present invention relates to a thin film depositing technique suitable for depositing various fine thin films of silicon such as amorphous silicon or poly-crystal silicon (poly-silicon).

BACK GROUND OF THE INVENTION

In a TFT, an organic EL, or the like, a silicon thin film is formed on a glass substrate, and a driving circuit is formed on the silicon thin film thus formed. A film depositing technique to deposit various thin films on the glass substrate is a important technical field to form basis of a semiconductor fabricating technique.

As an example of technologies for depositing a film on the glass substrate, a deposition process of the TFT (Thin Film Transistor) or the like is described. In the process of fabricating the TFT, an amorphous silicon thin film or a poly-silicon thin film is deposited on the glass substrate, and then, a driving circuit for driving a liquid crystal or a semiconductor control circuit such as a transistor or the like is formed on the silicon thin film. For a recent trend, a technique of depositing a poly-silicon thin film on the glass substrate is paid attention for a high speed operation. In a conventional art, when the poly-silicon film is formed, an amorphous silicon film is formed, and then the amorphous silicon film thus formed is converted to a poly-silicon film through laser annealing or thermal annealing.

An example of the conventional art to form the poly-silicon film on the glass substrate is described with reference to Patent document 1. First of all, an oxide film is formed on the glass substrate, and then an amorphous silicon film containing hydrogen is deposited thereon by means of CVD or the like. After that, a heat treatment is applied thereto to perform a dehydrogenation treatment followed by annealing through irradiation of an eximer laser to convert the amorphous silicon film to the poly-silicon film. Then, after being subjected to several processes, an appropriate poly-silicon film is obtained.

In general, the amorphous silicon film containing hydrogen described above is deposited by means of CVD or plasma CVD. A temperature of CVD or plasma CVD treatment is about 400° C. A dehydrogenation treatment is performed at a temperature of about 400° C. to 500° C. for about 60 minutes. The conventional technique described above has an advantage in highly free selection of a substrate material such as a low cost multiple ingredient glass, since the maximum temperature of the processing is about 500° C.

Patent document: Japanese Patent Application Publication No. 11-204794

DISCLOSURE OF THE INVENTION

Problem to be Solved

However, the dehydrogenation treatment for a long time period of 60 minutes is required in the conventional technique described above of forming the silicon thin film on the glass substrate, thus having a problem in productivity. In general, deposition, spattering, or various CVD are applied to form an amorphous silicon film on the glass substrate. In the plasma CVD used most often, silane ($SiH_4$) and disilane ($SiH_6$) in a raw material gas are decomposed by glow discharge, and the amorphous silicon thin film is grown on the glass substrate. As the substrate, crystal silicon, glass, heat resistant plastic or the like is used. The thin film can be grown at the temperature lower than 400° C. In addition, this method has a merit of being capable of fabricating in a large area at low cost. However, the film forming by silane is implemented through a batch process including a low pressure process. Accordingly, it is difficult to achieve remarkable productivity (film forming speed) improvement by the conventional system. Furthermore, when a film forming speed is intended to increase, a film thickness distribution is produced. Accordingly, when productivity is to be improved, a large scale glass substrate has to be applied, thus a large scale of equipment is necessary, which requires a large investment of facilities. In order to win the cost competition, sequential investment races are required to renew large scale equipment. Furthermore, since the equipment includes a vacuum unit, the cost of the equipment is expensive, and the remarkable improvement of the film forming speed cannot be expected.

In particular, in a case of the vacuum process using silane, a large amount of hydrogen is contained in the amorphous silicon thin film. Accordingly, the dehydrogenation process takes a long period of time prior to the heat annealing or laser annealing to coarsen a crystal grain size.

Further, a specific thickness is required to self-sustain the substrate due to the batch process. Further, an expense to polish the substrate is necessary, so that an expensive glass substrate such as a silica glass cannot be used while a low cost substrate can be used in a low temperature process. This feature becomes remarkable in the large scale substrate. When a low cost substrate is used, a barrier film formed of oxide silicon (SiOx) or silicon nitride (SiNx) is formed in order to prevent diffusion of an alkali metal or an alkali earth metal of the substrate, thereby introducing an unnecessary process.

In view of the problem in the conventional technique described above, an object of the present invention is to provide a method of continuously forming various thin films on a glass substrate at a high speed, and a glass substrate with a thin film fabricated by the method.

Means to Solve the Problem

According to a first aspect of the invention, a method of forming a thin film continuously comprises the steps of: moving a glass substrate with a thin strip shape having a constant db/2(d+b), where d is a thickness thereof and b is a width thereof in a cross section thereof, within a range from 0.015 to 0.15 through a film depositing region in which a reaction gas is supplied and a temperature is controlled to be high so that the glass substrate is rapidly heated; and moving continu-ously the glass substrate, immediately after the film depositing region, to pass through a cooling region in which a temperature is lower than that of the film depositing region, so that the glass substrate is rapidly cooled and the thin film formed of a component of the reaction gas is formed on the glass substrate. As described above, the glass substrate is formed in a thin strip shape, so that a heat capacity thereof is small while a surface area thereof is large. As a result, it is possible to rapidly heat and cool the glass substrate. Accordingly, the dense thin film of various types of materials can be formed on the substrate by the simple construction, in which the glass substrate with the thin strip shape simply passes through the film depositing region. Furthermore, it is possible to continuously form the thin film on the substrate at a high speed. Since the substrate is continuously moved, there is no problem concerning a thickness distribution in a longitudinal direction which is often caused in a case that the film depositing speed is high.

According to a second aspect of the invention, in the method of continuously forming a thin film in the first aspect, a moving speed of the glass substrate and the temperature of the film depositing region are adjusted according to a material, a thickness, and a heating length of the glass substrate, thereby adjusting a condition and a film thickness of the thin film formed on the glass substrate. Accordingly, it is possible to control a type of the substrate and the film thickness through simply controlling the moving speed of the substrate and the temperature in the film depositing region according to characteristics of the glass substrate.

According to a third aspect of the invention, in the method of continuously forming a thin film in the second aspect, a flow rate of the reaction gas is controlled to adjust the film forming speed, thereby adjusting the thickness of the thin film formed on the glass substrate. In addition, it is possible to more precisely adjust the thickness of the film through the adjustment of the flow rate of the reaction gas.

According to a fourth aspect of the invention, in the method of continuously forming a thin film in one of the first to third aspect, the thin film is deposited in the film depositing region through a thermal CVD treatment. Since the substrate with a small heat capacity is used, it is possible to rapidly heat and cool. For example, it is possible to continuously form the thin film through the thermal CVD at a temperature higher than 1,200° C.

According to a fifth aspect of the invention, in the method of continuously forming a thin film, the glass substrate is pre-heated prior to the film depositing region, and the thin film is deposited in the film depositing region through the thermal CVD. The method of forming the film is not limited to the thermal CVD, and various types of methods can be applied. In this case, since the substrate continuously moves, there is no problem concerning the thickness distribution in the longitudinal direction which is often caused in a case that the film forming speed is high.

According to a sixth aspect of the invention, in the method of continuously forming a thin film, the glass substrate is formed of a silica glass having a thickness within a range from 30 μm to 300 μm. The film depositing region is heated at a temperature within a range from 1,150° C. to 1,400° C. The reaction gas is a mixed gas of $H_2$ gas and DCS ($SiH_2Cl_2$, dichlorosilane) gas. The glass substrate is exposed in the film depositing region for a time period within a range from 0.1 second to 0.25 second. Immediately after the exposure, the glass substrate is exposed in the cooling region at a temperature up to 900° C., so that the silicon thin film is deposited on the glass substrate.

In the aspect, the dense silicon thin film without hydrogen having excellent surface property can be deposited on the glass substrate from the beginning. Accordingly, the dehydrogenation treatment and the annealing treatment taking a long time period can be omitted. Note that the film itself can be deposited through a specific high temperature treatment while supplying the raw material gas. However, when the high temperature state is maintained for a specific period of time, a migration occurs, thereby deteriorating the smoothness of the surface. Consequently in the aspect, the silicon thin film is exposed in the high temperature region for up to 0.2 second, and then rapidly cooled, thereby preventing the migration. In a case of the silicon thin film, the dense silicon thin film cannot be deposited when the temperature in the first region is less than 1,150° C. Considering a softening temperature of a substrate of, for example, silica, the temperature in the film depositing region (the first region) is preferably less than 1,400° C.

According to a seventh aspect of the invention, in the method of continuously forming a thin film in the sixth aspect, the glass substrate is heated to a temperature of at least 1,175° C. and maintained at a temperature of at least 1,050° C. for a period of time less than 0.2 second in the film depositing region to which the mixed gas is supplied at a prescribed flow rate. Then, the glass substrate is cooled to a temperature less than 900° C. at a cooling rate of at least 10,000° C./second in the cooling region, thereby forming the dense silicon thin film.

According to an eighth aspect of the invention, in the method of continuously forming a thin film in the seventh aspect, the mixed gas contains $H_2$ gas and DCS gas within a range from 2 mol % to 20 mol %.

The film depositing speed of the poly-silicon film depends on a DCS concentration in an atmosphere. More specifically, an inflection point of the film depositing speed exists at 2 mol % of the DCS concentration. Furthermore, when the DCS concentration is greater than 20 mol %, the silicon thin film deposited once may be etched. Accordingly, the mixed gas defined in the aspect is used preferably. In addition to $H_2$ and DCS, a small amount of gas component may be contained.

According to a ninth aspect of the invention, in the method of continuously forming a thin film in the eighth aspect, the mixed gas is supplied at an average flow rate of at least 0.5 m/second.

When the flow rate of the mixed gas increases, the film depositing speed increases. Since the film is formed in the high temperature atmosphere, the supply of the silicon is rate-controlling. When the flow rate is greater than a specific level, a thickness of a boundary layer in a laminar flow decreases, so that a large amount of silicon is supplied onto the substrate. When the flow rate becomes the specific level, an amount of silicon reaches saturation, and the correlation between the flow rate of the mixed gas and the film depositing speed becomes weak. Consequently, the flow rate of the mixed gas in the aspect is preferable, in view of high speed film deposition.

According to a tenth aspect of the invention, in the method of continuously forming a thin film in one of the first to ninth aspects, the glass substrate is formed a silica glass. In a case of the high temperature treatment, it is preferable to use the silica glass substrate having high heat resistance.

According to a first aspect of the invention, a glass substrate is formed with the method of continuously forming a thin film in one of the first to tenth aspects. Then, the glass substrate is cut into a desired length, and is connected in a width direction thereof, thereby forming the glass substrate with the thin film deposited thereon.

The first embodiment of the glass substrate is the glass substrate manufactured by the method of continuously forming a thin film according to any one of the above first to tenth embodiments. According to the above feature, the glass substrate with the thin film deposited thereon, which is thin, light weight and fully flexible, can be provided.

The second embodiment of the glass substrate is the glass substrate manufactured by the method of fabricating a glass substrate according to the above first embodiment. Thus, the glass substrate having a large surface area can be fabricated from the light weight thin strip shaped glass substrate.

The first embodiment of the semiconductor is the semiconductor device fabricated on the glass substrate according to the above first or second embodiments.

Effect of the Invention

According to the present invention, the thin glass substrate having the small heat capacity and the large surface area passes in the high temperature reaction passage constituting the film depositing region for a short period of time. Then, the glass substrate is rapidly cooled. Accordingly, it is possible to continuously depositing a desired type of thin film on the glass substrate at a high speed. Furthermore, according to the present invention, it is possible to continuously depositing the dense thin film having high smoothness with few particles on the glass substrate at a high speed simply through controlling the heat capacity, the surface area, and the moving speed of the glass substrate, the temperature of the film depositing region, and the gas flow rate. In addition, there is no need to concern about the film thickness distribution in the longitudinal direction generated when the film depositing speed is high.

In the method of continuously forming a thin film in the sixth aspect of the invention, the dense silicon thin film can be directly deposited on the silica glass. Accordingly, it is possible to eliminate a dehydrogenation treatment, an annealing treatment, and other appropriate treatments required for a long period of time.

Furthermore, it is possible to control the thickness of the silicon thin film through controlling the moving speed of the glass substrate and the gas flow rate, and to form the desired silicon thin film. In addition, although the silica glass is expensive compared with a multiple ingredient glass or the like, it is possible to fabricate the silica glass with the thickness less than 300 μm, thereby making it possible to produce at low cost. In particular, when the linear glass substrate is fabricated through drawing, it is possible to obtain a desired thickness, surface roughness, and flatness without polishing the substrate after the drawing, thereby reducing cost. Furthermore, the glass substrate is formed in the thin film shape. Accordingly, it is possible to make the final products thin and light. In addition, the glass substrate has high flexibility. Accordingly, it is possible to use the glass substrate in various usages compared with a glass substrate having high rigidity.

Figure 1:
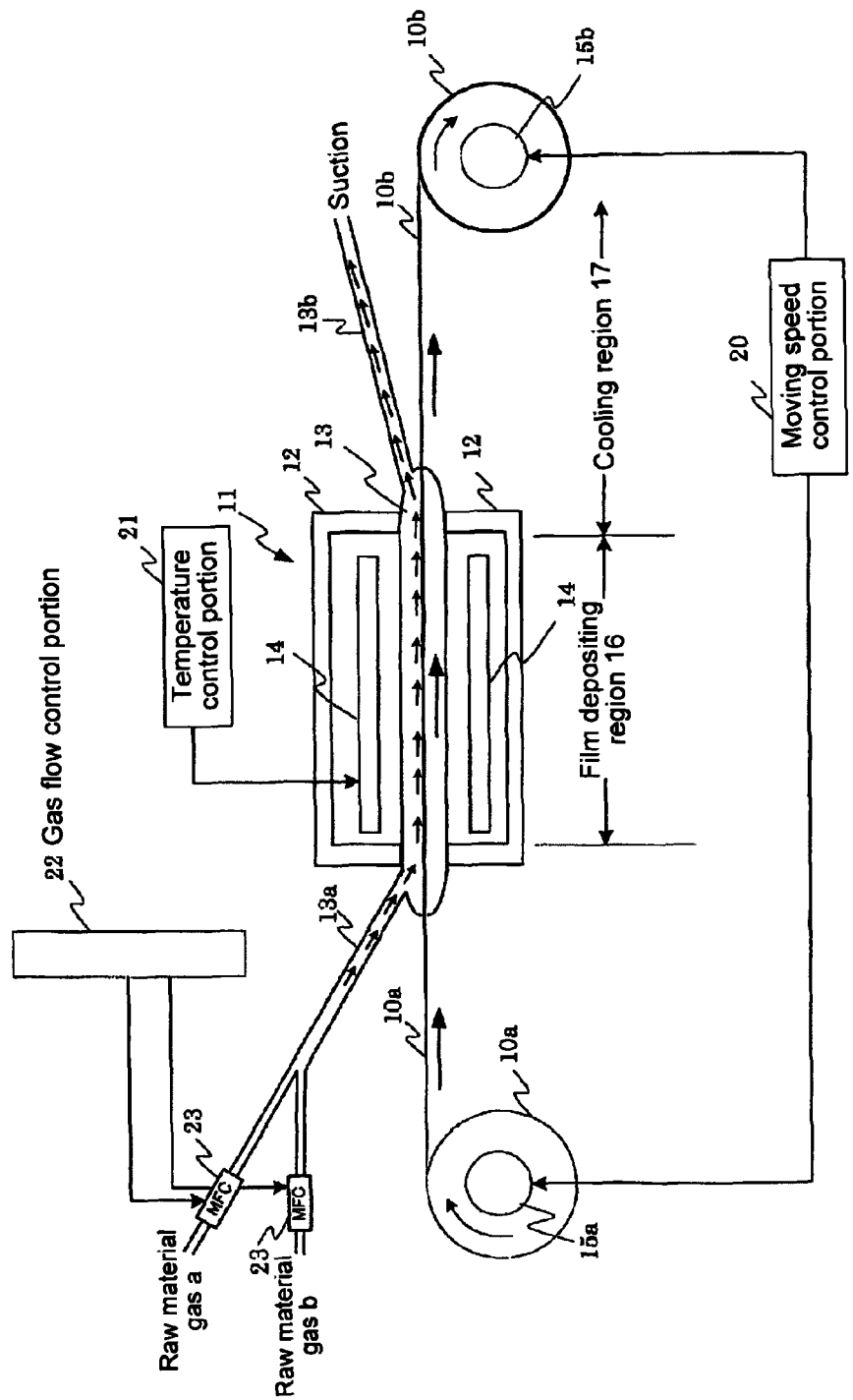
[FIG. 1] is a schematic view describing a principle of a method of continuously forming a film according to the invention.

| DESCRIPTION OF REFERENCE NUMERALS | |
|---|---|
| 10a | glass substrate before the film is deposited |
| 10b | glass substrate after the film is deposited |
| 11, 31 | film depositing system |
| 12, 32 | furnace shell |
| 13, 33 | reaction tube |
| 14 | heat source |
| 15a | supply drum |
| 15b | winding drum |
| 16 | film depositing region |
| 17 | cooling region |
| 34 | infra-red radiation generating device |
| 35 | infra-red radiation absorbing body (susceptor) |
| 36 | glass substrate |
| 37 | first region |
| 38 | second region |
| 39 | intermediate region |
| 41 | maximum temperature |
| 42 | cooling rate |

BEST MODE FOR CARRYING OUT THE INVENTION

Preferred embodiments of the method of continuously forming a thin film according to the invention are described with reference to the drawings.

FIG. 1 is a schematic view to describe the principle of the method of continuously forming a thin film of the invention. In order to facilitate the understanding of the invention, an example of the method in which a silicon thin film is deposited on a silica glass substrate is described. The present invention is not limited to the deposition of the silicon thin film. Various thin films can be deposited corresponding to applied reaction gases. Furthermore, the glass substrate is not limited to the silica glass substrate. Various glass substrates or PYREX (registered trademark) can be applied corresponding to temperature conditions or the like. The film depositing system 11 depicted in FIG. 1 is a high temperature thermal CVD (Chemical Vapor Deposition), and is shown in FIG. 1 as an example that the film is deposited thereby. The film can be deposited by the film depositing system applying the plasma CVD.

The reference numeral 10a denotes the glass substrate prior to the film deposition, and the reference numeral 10b denotes the glass substrate after the film deposition in FIG. 1. Both of the glass substrates are thin strip shaped glass substrates. FIG. 1 exemplifies the case that the film is deposited by the thermal CVD of at least 1,200° C., and the silica glass substrate 10a is used as the glass substrate. The silica glass substrate 10a is fabricated to a thin strip shape having a thickness from about 30 μm to 300 μm, and a width of from several mm to several tens mm, for example. With the thin shape, the heat capacity thereof becomes small, and the surface area thereof becomes large, so that the rapid heating and the rapid cooling of the substrate are enabled. Consequently, it is possible to continuously deposit the thin film on the substrate at a high speed.

For example, when the base glass is heated and drawn, the base glass is drawn under the condition in which gas flows in the same fashion in both sides of the substrate glass in the heating furnace, so that the silica glass can be formed in a thin strip shape (refer to international patent publication No. WO/2006/070527). An average surface roughness in the side faces of the thin strip shaped glass substrate is preferably up to 200 nm, more preferably up to 10 nm. Due to the average surface roughness, the flexibility of the glass substrate against the twisting or the like is improved, and the possibility of the breakage or destruction of the glass substrate can be effectively lowered.

The glass substrate fabricated in a thin strip shape is supplied from a supply drum 15a. The glass substrate is passed at a high speed in the film depositing system 11, and then wound by a winding drum 15b. The glass substrate may be directly supplied from the drawing furnace in which the glass substrate is drawn. When the film is deposited on a coated glass substrate, the process to remove the coating and the process to re-apply the coating may be included. When the glass substrate passes in the film depositing system 11, a thin film corresponding to the reaction gas is deposited on the glass substrate by the thermal CVD.

The film depositing system 11 is a high temperature reaction furnace, in which the film is deposited at the temperature of at least 1,200° C. by the thermal CVD on the glass substrate. Only the basic configuration of the system is depicted in the drawing. A reaction tube 13 is provided in the center portion of a furnace shell 12. The glass substrate is heated by a heat source 14 such as an infra-red radiation generating device from both of the upper side and the lower side of the reaction tube 13. A reaction gas is supplied to the reaction tube 13. For example, when a silicon film is deposited, a mixed gas of $H_2$ and DCS (dichlorosilane: $SiH_2Cl_2$) is supplied at a prescribed speed from an induction tube 13a and suctioned through a suction tube 13b. The flow velocity and the flow rate of the respective gases are controlled to be constant by a mass flow controller (MFC) 23.

When the silicon film is deposited on the silica glass substrate, the temperature in the reaction tube (film depositing region 16) is heated to the temperature range of within 1,150 to 1,400° C., and the silica glass substrate is moved to pass through the film depositing region 16 having a length of about 70 mm for a short time of about 0.2 second. After passing the film depositing region 16, the silica glass substrate is rapidly cooled in a cooling region 17. The temperature in the cooling region may be the same as the temperature of ambient air, or may be controlled to be up to 900° C. In the example depicted in FIG. 1, the silica glass substrate is cooled by ambient air in the cooling region 17.

The silica glass substrate is rapidly heated in the film depositing region 16, and then rapidly cooled in the cooling region 17, so that a thin film from about 30 nm to 500 nm thickness is deposited thereon. The dissolved silicon at a high temperature is deposited on the surface of the linear shaped silica glass substrate, and then, the silica glass with the silicon deposited thereon is rapidly cooled, so that the silicon is fixed on the silica glass substrate without causing migration to form the thin film. If the cooling rate is slow and the high temperature condition continues, the production of silicon particle is accelerated by the high temperature. Consequently, it is difficult to deposit the thin film having excellent surface quality. Furthermore, since the silica glass substrate is heated to a high temperature, crystals are produced in the thin film by the residual heat of the high temperature silica glass substrate in the rapid cooling process. Accordingly, when the residual heat is maintained at a high temperature for a prescribed time period (when the temperature of the substrate is high), crystals are produced to be poly-silicon. Alternatively, when the residual heat is low and the temperature of the substrate is low, amorphous silicon is thought to be prepared. The speed of moving the linear shaped glass substrate depends on a length wound around the bobbin to supply the linear shaped glass substrate. For the length of about 10 m, the speed of moving the linear shaped glass substrate is preferably within a range from about 25 to 500 mm/second. For the length from 100 m to several km, the speed of moving the linear shaped glass substrate is preferably within a range from 1 to 10 m/second, and for the length of at least 100 km, the speed of moving the linear shaped glass substrate is preferably at least 10 to 50 m/second. Needless to say, the temperature, length or type of the reaction furnace need to be optimized corresponding to the speed of the linear shaped glass substrate.

The glass substrate passes in the high temperature reaction furnace for an extremely short time period, and then is rapidly cooled to form the thin film. Accordingly, the thin film can be continuously deposited at a high speed, and in addition, it is possible to provide the highly smooth and dense thin film without producing a particle and with few impurities attached. Furthermore, the thickness of the thin film is determined by the accumulated staying time and the concentration of the reaction gas in the reaction furnace. For example, at the raw material gas concentration of at least 3 mol %, an excellent speed of depositing the thin film can be secured.

As described above, the condition and the thickness of the deposited thin film can be determined by the property of the glass substrate such as a density, a specific heat, and the like, the temperature in the reaction tube, the speed of moving the glass substrate, and the flow velocity of the reaction gas or the like. Accordingly, the temperature in the furnace, the speed of moving the glass substrate, and the flow velocity of the reaction gas are precisely controlled corresponding to the material of the glass substrate to adjust the film quality and the film thickness. More specifically, the temperature in the furnace, the speed of moving the glass substrate, and the flow velocity of the reaction gas are precisely controlled by the moving speed control device 20, the temperature control portion 21, and the gas flow control portion 22, corresponding to the type and the thickness of the targeted thin film.

In FIG. 1, the film depositing system 11 is simplified in order to facilitate the understanding thereof. Practically, a susceptor or the like is arranged in the center portion of the film depositing system 11 to attain a high temperature of at least 1,200° C. In this case, the susceptor portion becomes the film depositing region 16, and the pre-heating region and the cooling region 17 are arranged before and after the susceptor portion, respectively. In FIG. 1, an example in which the thin film is deposited on only one surface of the glass substrate is depicted in order to facilitate the understanding. The reaction gas may be supplied to both faces of the glass substrate to deposit thin films on both surfaces of the glass substrate.

Figure 2:
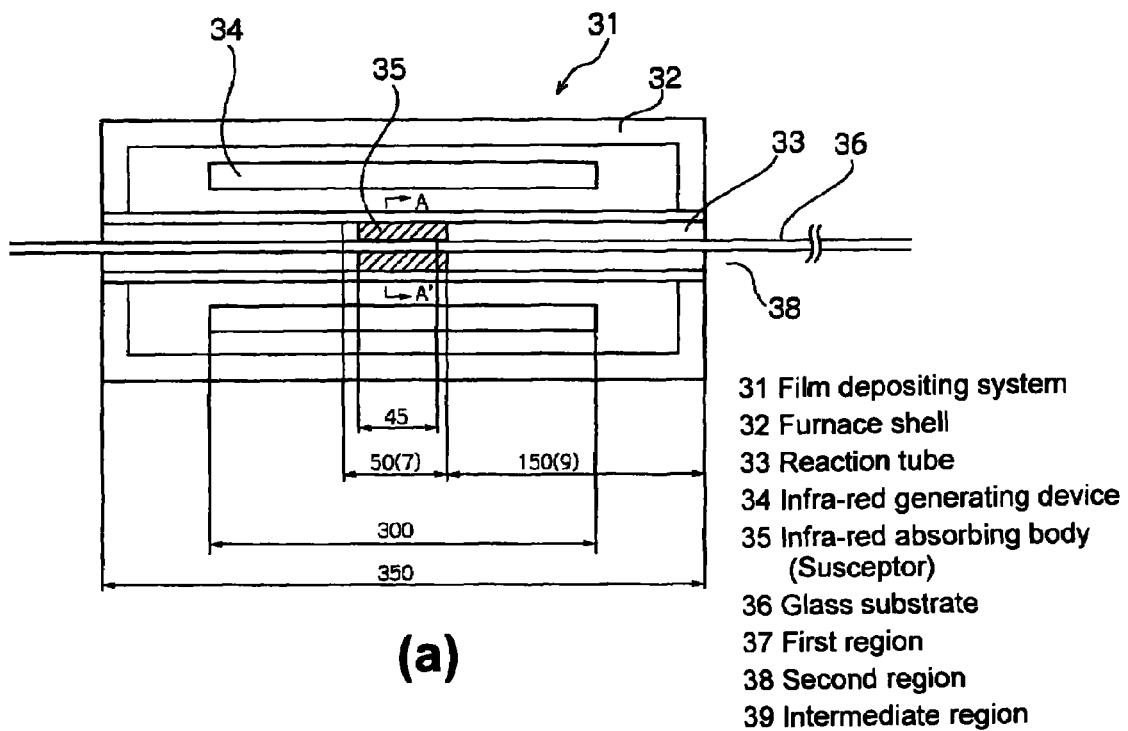
[FIG. 2] (a) is a view showing a configuration of a film depositing system used to deposit a silicon thin film as an example of the method of continuously forming the film according to the invention, (b) is a schematic view showing a positional relationship of a susceptor and a glass substrate in a cross section taken along A-A' direction in FIG. 2(a), and (c) is a cross sectional view showing other example of a reaction tube.
Figure 2:
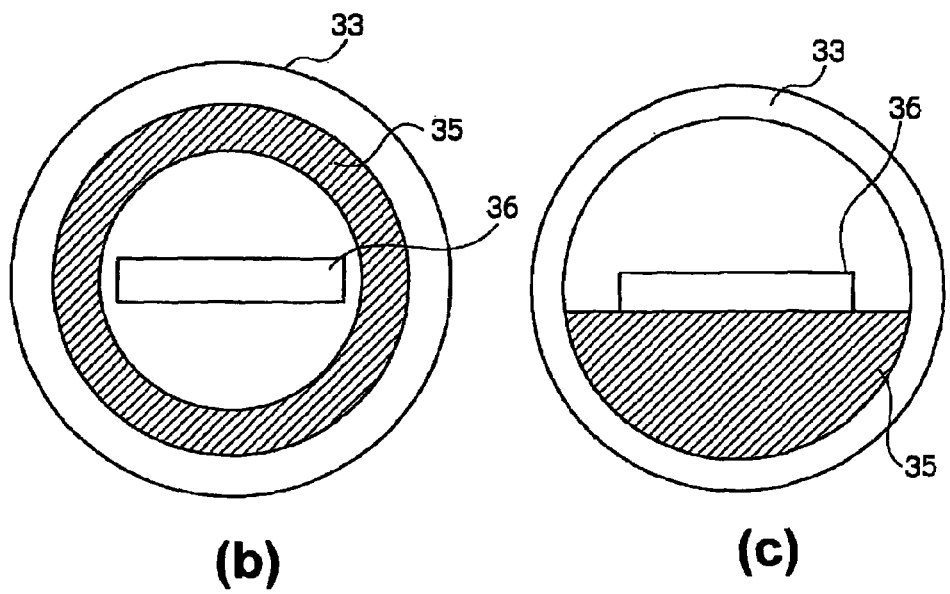

In order to implement the present invention, the thin film depositing system is prepared and the silicon thin film is formed as an experiment. Various thin film depositing conditions are described based on the test thin film. FIG. 2(a) depicts a thin film depositing system 31 thus prepared. In the film depositing system 31, a reaction tube 33 made of silica is installed within a furnace shell 32; an infra-red radiation generating device 34 is installed around the silica reaction tube; and an infra-red radiation absorbing body (i.e., susceptor) 35 made of carbon is installed within the reaction tube 33. The film depositing system 35 is configured such that the infra-red radiation emitted from the infra-red radiation generating device 43 transmits the reaction tube 33 and is absorbed by the infra-red radiation absorbing body 35. Accordingly, the infra-red radiation absorbing body 35 generates heat to turn the surrounding area to the high temperature region. The reaction tube 33 has an inner diameter of 6 mm and a length of 350 mm. The effective length of the infra-red radiation generating device 34 is 300 mm. The infra-red absorbing body 35 has a length of 45 mm, and is installed within the reaction tube 33 at the center portion along the longitudinal direction. The mixed gas of $H_2$ as the raw gas and 9 mol % of DCS ($SiH_2Cl_2$) gas mixed thereto is supplied to the reaction tube 33 at an average flow velocity of 1.3 m/second. FIG. 2(b) schematically depicts a cross sectional view along A-A' line in FIG. 2(a), which schematically shows a location of the infra-red radiation absorbing body 35 relative to the glass substrate 36. Furthermore, FIG. 2(c) depicts another example of the reaction tube. As depicted in FIG. 2(b) or FIG. 2(c), the glass substrate 36 may contact or may not contact with the infra-red radiation absorbing body 35. Although the film thickness distribution in the longitudinal direction may be ignored, the film thickness distribution in the width direction may not be ignored as the width becomes wider. In this case, the inner diameter of the reaction tube along the width direction is preferably 1.2 to 10 times of the width of the glass substrate.

As the glass substrate 36, a sufficiently long body made of silica having a thickness of 90 μm, a width of 0.88 mm, and a rectangular cross section is prepared (which corresponds to the thin strip shaped glass substrate). The glass substrate thus prepared is run in the reaction tube 33 at the speed of 400 mm/second relative to the reaction tube 33 while one end of the substrate is held. The output power of the infra-red radiation generating device 34 is adjusted to be set such that the temperature of the gas is at the most 1,300° C. in the first region (which corresponds to the film depositing region 16) 37 of 50 mm along the longitudinal direction in the vicinity of the infra-red radiation absorbing body 35, and is 1,250° C. at the output side end.

The zone of 150 mm length from the back end of the first region 37 to the outlet of the reaction tube 33 is an intermediate region (which corresponds to the preliminary cooling region) 39. Following the outlet of the reaction tube 33, the second region (which corresponds to the cooling region 17) 38 of the room temperature is positioned.

The staying time of the glass substrate in each of the regions under the above described condition is calculated. The staying time in the first region 37 is 0.125 second, and the staying time in the zone between the first region 37 and the second region 38 is 0.375 second. In other words, the glass substrate is exposed to the first region 37 for 0.125 second, and then exposed to the second region 38 for 0.375 second.

The temperature history of the glass substrate 36 is calculated under the above described condition. The glass substrate 36 is heated up to 1,197° C. in the first region 37, then the state of at least 1,050° C. maintains for 0.075 second, and the average cooling rate is 12,000 K/second in the process of moving from the intermediate region 39 to the second region 38 where the temperature is lowered to 900° C. The method of calculating the temperature history of the glass substrate 6 based on the condition such as the surrounding temperature is described hereunder.

A balance equation of the convective heat transfer from the heat transfer of the running substrate and the surface of the fiber is represented by the following:

$$d \times b \times \rho \times Cp \times v \times \delta T/\delta z = -(2d+2b) \times h \times (T-T2) \quad (1)$$

The relation between $T_i$ and $T_{i-1}$ is expressed from the equation (1) by the following difference formula, while divided in the Z direction by $\Delta z$:

$$T_i = (T_{i-1} - t)\exp(-2(d+b)/(d \times b \times \rho \times Cp) \times h \times \Delta z/v) + t \quad (2)$$

Where, $T_n$: substrate temperature (° C.); d: thickness of the substrate, in the above condition, 0.00009 m; b: width of the substrate, in the above condition, 0.00088 m; ρ: density of the substrate, density of silica, $2.2 \times 10^3$ kg/m³; Cp: specific heat of the substrate, specific heat of silica, $1.05 \times 10^3$ J/kg·k; v: speed of movement of the substrate, in the above condition, 0.4 m/sec.; t: surrounding gas temperature, calculated under the condition of the first region temperature of 1250° C. at outlet, intermediate region temperature of 500° C. and the second region temperature of 25° C.; h: convective flow heat transfer rate to the surrounding gas, 2,000 w/m²·k The information concerning the shape of the substrate in the equation (2) relates to a portion of db/2(d+b) which is (volume per unit length)/(surface area per unit length). Other portions are factors determined by the gas condition and heat condition. When this value is the same, it can be said that the substrate is subjected to the same temperature history. The convective flow heat transfer rate h is determined by a type of the mixed gas and the flow velocity of the gas.

(Example of Depositing the Silicon Thin Film and Evaluation Thereof)

Several silicon thin films are deposited on the substrate as samples, using the above described film depositing system and appropriately changing the above described conditions, and evaluated. In the evaluation, the surface roughness of the silicon thin film is measured by AFM (Atomic Force Microscope), and at least 5 nm in the Rms value according to the JIS standard is classified as failure. The crystalline property is evaluated by the measurement of Raman spectrum.

The temperature and the cooling rate of the substrates are calculated in all samples under the following conditions: ρ (density of the substrate) is the density of silica, $2.2 \times 10^3$ kg/m³, and Cp (specific heat of the substrate) is the specific heat of silica, $1.05 \times 10^3$ J/kg·k. Furthermore, the temperature at the outlet side of the first region 37 is the temperature of the first region 37. The temperature of the intermediate region 39 is 500° C., the temperature of the second region 38 is 25° C., regardless of the temperature of the first region 37. In addition, concerning the glass substrates with the width thereof over the prescribed value, the shape of the reaction tube 33 is modified to have the same inner cross section as that of the inner diameter of 6 mm, and the glass substrate 36 can be passed therein, and the tests are carried out. The composition of the mixed gas and the flow velocity of the mixed gas to be supplied are appropriately adjusted so as to have at least 50 nm thickness of the thin film under the above described condition, and the tests are carried out. The manufacturing conditions of the samples, and the results of the evaluation are shown in Table 1. In evaluation, the surface roughness of the silicon thin film is measured by AFM, and at least 5 nm in the Rms value according to the JIS standard is classified as a failure. The crystalline property is evaluated by the measurement of Raman spectrum, and the sample not recognized as the poly-silicon film is classified as a failure. Therefore it is preferable that the poly-silicon film is formed under the condition satisfying both evaluations of the surface roughness and crystalline property.

TABLE 1

| Number | Material of the substrate | Width of the substrate (mm) | Thickness of the substrate (mm) | Moving speed (mm/sec) | temperature in the first region (° C.) | Length of the first region (mm) | Staying time period in the first region (sec) | Length of the intermediate region (mm) |
|---|---|---|---|---|---|---|---|---|
| 1 | Silica | 0.50 | 0.050 | 400 | 1250 | 50 | 0.125 | 150 |
| 2 |  | 0.71 | 0.071 | 400 | 1250 | 50 | 0.125 | 150 |
| 3 |  | 0.83 | 0.050 | 400 | 1250 | 50 | 0.125 | 150 |
| 4 |  | 0.88 | 0.090 | 400 | 1250 | 50 | 0.125 | 150 |
| 5 |  | 0.89 | 0.090 | 400 | 1250 | 50 | 0.125 | 150 |
| 6 |  | 1.01 | 0.100 | 400 | 1250 | 50 | 0.125 | 150 |
| 7 |  | 1.18 | 0.110 | 400 | 1250 | 50 | 0.125 | 150 |
| 8 |  | 1.83 | 0.110 | 400 | 1250 | 50 | 0.125 | 150 |
| 9 |  | 1.38 | 0.140 | 400 | 1250 | 50 | 0.125 | 150 |
| 10 |  | 2.00 | 0.200 | 400 | 1250 | 50 | 0.125 | 150 |
| 11 |  | 10.00 | 0.080 | 400 | 1250 | 50 | 0.125 | 150 |
| 12 |  | 10.00 | 0.120 | 400 | 1250 | 50 | 0.125 | 150 |
| 13 |  | 10.00 | 0.200 | 400 | 1250 | 50 | 0.125 | 150 |
| 14 |  | 0.88 | 0.090 | 400 | 1250 | 50 | 0.125 | 150 |
| 15 |  | 0.88 | 0.090 | 300 | 1250 | 50 | 0.187 | 150 |
| 16 |  | 0.88 | 0.090 | 100 | 1250 | 50 | 0.500 | 150 |
| 17 |  | 0.89 | 0.090 | 800 | 1250 | 100 | 0.125 | 150 |
| 18 |  | 0.88 | 0.090 | 400 | 1250 | 50 | 0.125 | 300 |

| Number | Staying time period in the intermediate period (sec) | Temperature of the substrate (° C. calculated value) | Time period of maintaining at least 1050 (see calculated value) | Cooling rate to the temperature of at least 900° C. (K/see calculated value) | Polysilicone net | Rms value (mm)/success or failure | Total evaluation |
|---|---|---|---|---|---|---|---|
| 1 | 0.375 | 1244 | 0.0775 | $2.5 \times 10^5$ | ○ | 4.5/○ | ○ |
| 2 | 0.375 | 1225 | 0.0650 | $1.3 \times 10^5$ | ○ | 3.8/○ | ○ |
| 3 | 0.375 | 1207 | 0.0525 | $1.4 \times 10^5$ | ○ | 3.2/○ | ○ |
| 4 | 0.375 | 1200 | 0.0450 | $1.5 \times 10^5$ | ○ | 3.0/○ | ○ |
| 5 | 0.375 | 1198 | 0.0450 | $1.4 \times 10^5$ | ○ | 2.5/○ | ○ |
| 6 | 0.375 | 1175 | 0.0350 | $1.2 \times 10^5$ | ○ | 2.4/○ | ○ |
| 7 | 0.375 | 1150 | 0.0150 | $1.1 \times 10^5$ | X | 2.0/○ | ○ |
| 8 | 0.375 | 1142 | 0.0150 | $1.0 \times 10^5$ | X | 1.8/○ | X |
| 9 | 0.375 | 1113 | 0.0000 | $0.8 \times 10^5$ | X | 1.8/○ | X |
| 10 | 0.375 | 1022 | 0.0000 | $0.5 \times 10^5$ | X | 2.0/○ | X |
| 11 | 0.375 | 1201 | 0.0500 | $1.4 \times 10^5$ | ○ | 3.1/○ | X |
| 12 | 0.375 | 1150 | 0.0075 | $1.1 \times 10^5$ | X | 2.0/○ | ○ |
| 13 | 0.375 | 1113 | 0.0000 | $0.8 \times 10^5$ | X | 2.5/○ | X |
| 14 | 0.375 | 1201 | 0.0450 | $1.2 \times 10^5$ | ○ | 2.3/○ | ○ |
| 15 | 0.050 | 1200 | 0.0933 | $1.0 \times 10^5$ | ○ | 4.4/○ | ○ |
| 16 | 1.500 | 1198 | 0.4300 | $0.6 \times 10^5$ | ○ | 10.5/X | X |
| 17 | 0.188 | 1201 | 0.0400 | $1.2 \times 10^5$ | ○ | 2.6/○ | ○ |
| 18 | 0.750 | 1201 | 0.0450 | $1.2 \times 10^5$ | ○ | 8.0/X | X |

As evident from Table 1, in a case that the temperature of the film depositing region 16 is constant, the successful deposition of the poly-silicon film depends on the heating speed and the cooling speed of the glass substrate. Consequently, when the temperature and the length of the film depositing region 16 are constant, it is possible to control the deposition of the poly-silicon film by controlling the line speed of moving the glass substrate.

Table 2 shows the film depositing conditions and the results of the evaluation of the deposited silicon film in a case that various silicon films are formed changing the condition. The film depositing condition is the same as that in Table 1. The types of deposited silicon films are classified into three, i.e., amorphous silicon (a-Si), fine crystal silicon (μc-Si), and poly-silicon (p-Si).

TABLE 2

| Sample No. | Material of the substrate | Width of the substrate (mm) | Thickness of the substrate (mm) | Moving speed (mm/sec) | Temperature in the first region (° C.) | Length of the first region (mm) |
|---|---|---|---|---|---|---|
| 18 | Silica | 0.5 | 0.05 | 400 | 1250 | 50 |
| 19 |  | 0.71 | 0.071 | 400 | 1250 | 50 |
| 20 |  | 0.83 | 0.08 | 400 | 1250 | 50 |
| 21 |  | 0.88 | 0.09 | 400 | 1250 | 50 |
| 22 |  | 0.89 | 0.09 | 400 | 1250 | 50 |
| 23 |  | 1.01 | 0.1 | 400 | 1250 | 50 |
| 24 |  | 1.18 | 0.12 | 400 | 1250 | 50 |
| 25 |  | 1.23 | 0.12 | 400 | 1250 | 50 |
| 26 |  | 1.38 | 0.14 | 400 | 1250 | 50 |
| 27 |  | 2 | 0.2 | 400 | 1250 | 50 |
| 28 |  | 10 | 0.08 | 400 | 1250 | 50 |
| 29 |  | 10 | 0.12 | 400 | 1250 | 50 |

TABLE 2-continued

| | | | | | |
|---|---|---|---|---|---|
| 30 | 10 | 0.2 | 400 | 1250 | 50 |
| 31 | 0.88 | 0.09 | 400 | 1250 | 50 |
| 32 | 0.88 | 0.09 | 300 | 1250 | 50 |
| 33 | 0.88 | 0.09 | 200 | 1250 | 50 |
| 34 | 0.89 | 0.09 | 100 | 1250 | 50 |
| 35 | 0.88 | 0.09 | 800 | 1250 | 100 |

| Sample No. | Staying time period in the first region (sec) | Staying time period at the temperature of at least 1050° C. (sec) | Evaluated crystalline propery | ⊚ excellent to good<br>○ appropriate<br>X failure | Rms value (mm)/ success or failure |
|---|---|---|---|---|---|
| 18 | 0.125 | 0.0775 | p-Si | ○ | 4.5 |
| 19 | 0.125 | 0.065 | p-Si | ○ | 3.8 |
| 20 | 0.125 | 0.0525 | p-Si | ⊚ | 3.2 |
| 21 | 0.125 | 0.045 | p-Si | ⊚ | 3 |
| 22 | 0.125 | 0.045 | p-Si | ⊚ | 2.5 |
| 23 | 0.125 | 0.035 | p-Si | ○ | 2.4 |
| 24 | 0.125 | 0.015 | μc-Si | ⊚ | 2 |
| 25 | 0.125 | 0.015 | μc-Si | ⊚ | 1.8 |
| 26 | 0.125 | 0 | μc-Si | ⊚ | 1.9 |
| 27 | 0.125 | 0 | a-Si | ⊚ | 2 |
| 28 | 0.125 | 0.05 | p-Si | ⊚ | 3.1 |
| 29 | 0.125 | 0.0075 | μc-Si | ⊚ | 2 |
| 30 | 0.125 | 0 | a-Si | ⊚ | 2.5 |
| 31 | 0.125 | 0.045 | p-Si | ⊚ | 2.3 |
| 32 | 0.167 | 0.093333 | p-Si | ○ | 4.4 |
| 33 | 0.250 | 0.205 | p-Si | X | 5.5 |
| 34 | 0.500 | 0.43 | p-Si | X | 10.5 |
| 35 | 0.125 | 0.04 | p-Si | ⊚ | 2.5 |

As evident from Table 2, various conditions of the silicon deposition are possible when the film depositing condition is changed. Furthermore, as evident from the sample No. 14 in Table 1 and the sample Nos. 33 and 34, the surface roughness Rms is deteriorated when the staying time period at the temperature of 1,050° C. and above is longer than 0.2 second. Accordingly, it is preferable to control the staying time period at the temperature of 1,050° C. and above to be up to 0.2 second in the film depositing process. Consequently, the film depositing speed is preferably at least 500 nm/sec when the silicon thin film of at least 100 μm thickness is formed, so that film deposition of at least 100 μm thickness for 0.2 second can be continuously implemented.

Figure 3:
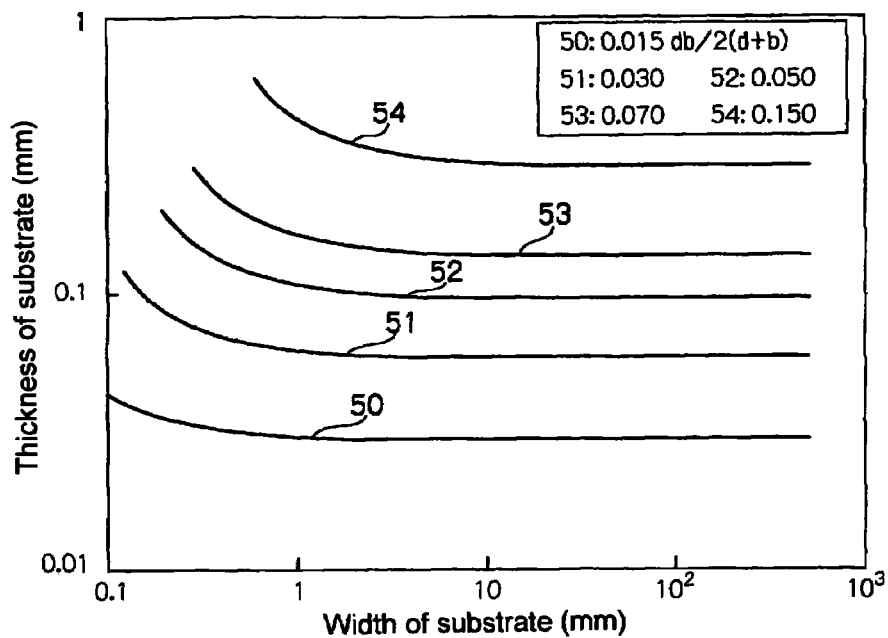
[FIG. 3] is a graph representing dependency of a constant db/2(d+b) on a thickness of a substrate, in a case that a width is sufficiently large to the thickness of the substrate.
Figure 4:
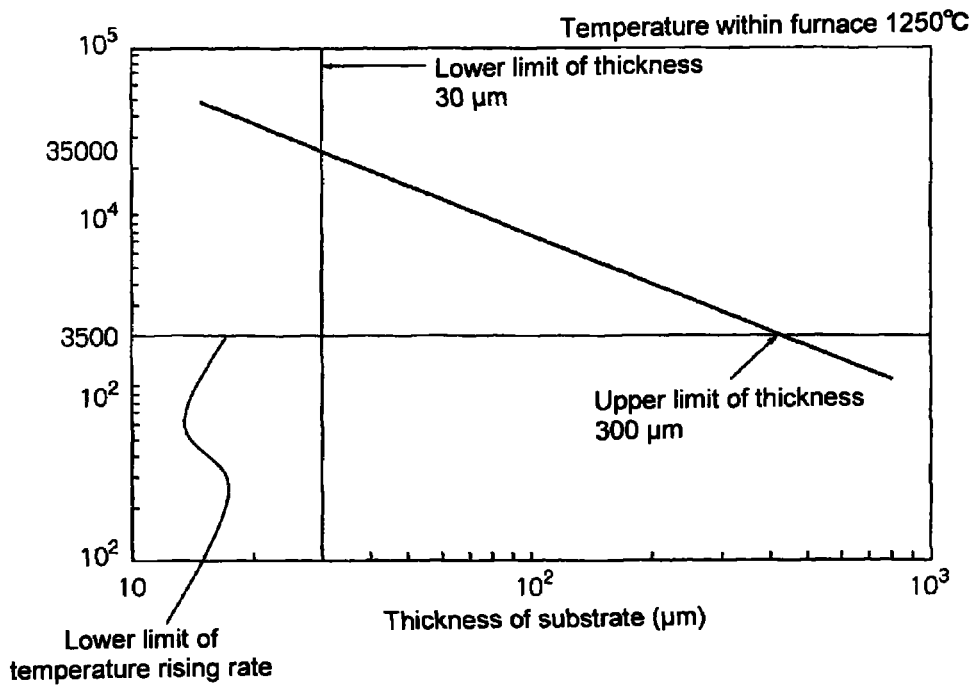
[FIG. 4] is a graph representing a relation between a temperature rising rate and the thickness of the substrate.

FIGS. 3 and 4 are graphs respectively showing the relation between the thickness of the substrate, width of the substrate and the rate of temperature rising. FIG. 3 depicts the graph showing the dependency of the constant db/2(d+b) on the thickness of the substrate in a case that the width of the substrate is sufficiently large to the thickness of the substrate. FIG. 4 depicts the graph showing the relation between the rising rate of the temperature of the substrate and the thickness of the substrate. As evident from FIG. 3, the constant db/2(d+b) becomes almost constant corresponding to the thickness of the substrate, in a case that the width of the substrate is about 10 mm. As a result, if the thickness is constant, the constant db/2(d+b) becomes almost identical, even if the width becomes large. When the constant db/2(d+b) is identical, the temperature history becomes the same, so that the substrate has substantially the same temperature history regardless of the width of the substrate.

FIG. 4 depicts the relation between the thickness of the substrate and the rising rate of the temperature of the substrate under the condition in which the temperature of the heating furnace is 1,250° C., the length of the temperature region (the first temperature region) is 50 mm, and the temperature of the substrate at the time of entering the first region is 500° C. The value is calculated by considering the rate rising of the temperature to be the function only with the thickness while the width of the substrate is 10 mm. As evident from the graph, the rising rate of the temperature is 35,000 K/sec in a case that the thickness is 30 μm, and is 3,500 K/sec in a case that the thickness is 300 μm.

In a case that the thickness is over 300 μm, the rate of temperature rising becomes up to several thousand ° C./sec after 0.2 second, thus the temperature of the substrate is too low to obtain the dense thin film for 0.2 second of film deposition time. Therefore, it is not preferable. At that time, the constant db/2(d+b) becomes 0.15. Furthermore, with the thickness of up to 30 μm, the thin film is highly expected to be broken due to a less strength of the substrate, thus not preferable. At that time, the constant db/2(d+b) becomes 0.015. Consequently, the constant db/2(d+b), which is determined by the shape of the substrate, is preferably within a range of from 0.15 to 0.015.

Figure 5:
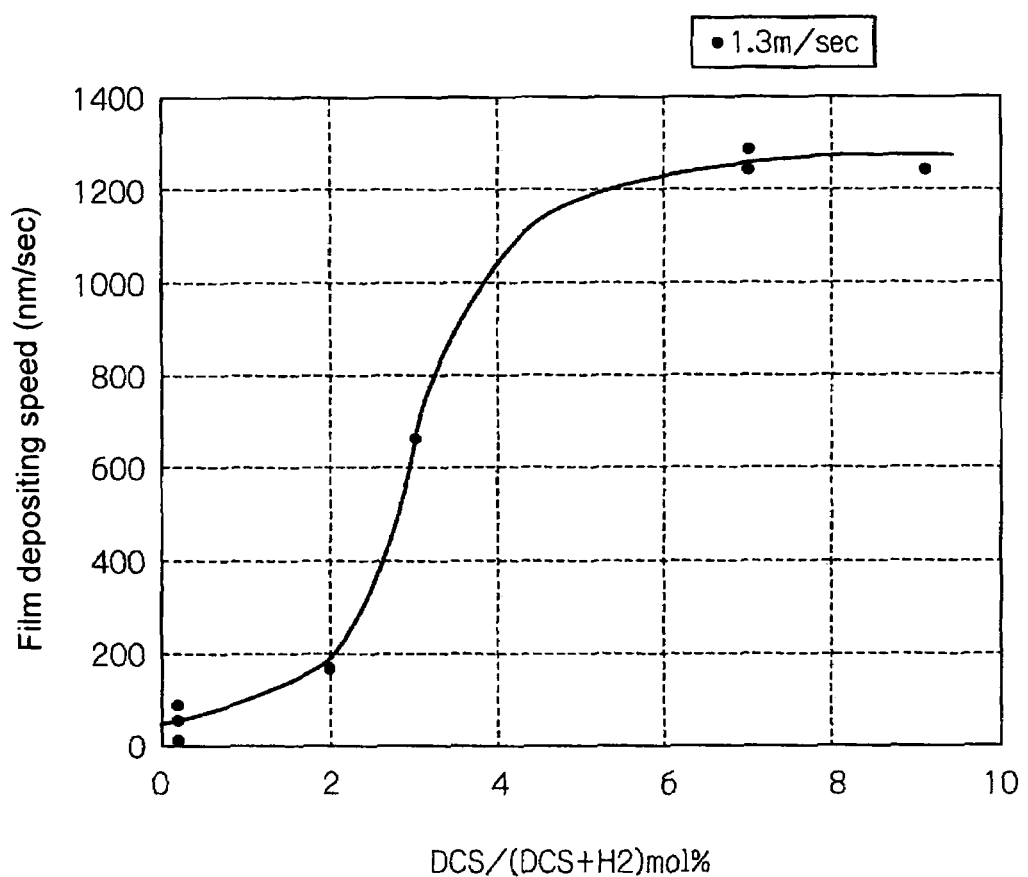
[FIG. 5] is a graph representing a relation between a DCS concentration and a growing speed (film depositing speed) of the silicon thin film.

FIG. 5 depicts the relation between the DCS concentration and the film depositing speed in a case that the average flow rate of the mixed gas is 1.3 m/sec. In FIG. 4, the inflection point appears at the DCS concentration of 2 mol %. Accordingly, the DCS concentration is preferably at least 2 mol % in view of high speed film deposition.

What is claimed is:

1. A method of continuously forming a thin film comprising the steps of:
   moving a glass substrate with a thin continuous strip shape having a constant db/2(d+b), where d is a thickness thereof in a range from 30 μm to 300 μm and b is a width thereof in a cross section thereof, within a range from 0.015 to 0.15 through a film depositing region, in which a reaction gas is supplied and a temperature is controlled to be higher than 1,050° C., in a suspended state in the reaction gas for a period of time between 0.1 second and 0.25 second, so that the glass substrate is heated, and the reaction gas is a mixed gas of $H_2$ gas and DCS ($SiH_2Cl_2$, dichlorosilane) gas; and
   moving continuously the glass substrate, immediately after the glass substrate passes through the film depositing region, to pass through a cooling region in which a temperature is lower than 900° C. in a suspended state, so that the glass substrate is cooled and the thin film formed of a component of the reaction gas is formed on the glass substrate.

2. The method of continuously forming a thin film according to claim 1, wherein a moving speed of the glass substrate and the temperature of the film depositing region are adjusted according to a material, a thickness, and a heating length of the glass substrate, thereby adjusting a condition and a film thickness of the thin film formed on the glass substrate.

3. The method of continuously forming a thin film according to claim 2, wherein a flow rate of the reaction gas is controlled to adjust the thickness of the thin film formed on the glass substrate.

4. The method of continuously forming a thin film according to claim 1, wherein the thin film is deposited in the film depositing region through a thermal CVD treatment.

5. The method of continuously forming a thin film according to claim 1, wherein the glass substrate is pre-heated prior to the film depositing region, and the thin film is deposited in the film depositing region through a plasma CVD.

6. The method of continuously forming a thin film according to claim 1, wherein the glass substrate is formed of a silica glass having a thickness within a range from 30 μm to 300 μm; the film depositing region is heated at a temperature within a range from 1,150° C. to 1,400° C.; the glass substrate is exposed in the film depositing region for a time period within a range from 0.1 second to 0.25 second; and immediately after the exposure, the glass substrate is exposed in the cooling region at a temperature up to 900° C. so that a silicon thin film is deposited on the glass substrate.

7. The method of continuously forming a thin film according to claim 6, wherein the glass substrate is heated to a temperature of at least 1,175° C. and maintained at a temperature of at least 1,050° C. for a period of time less than 0.2 second in the film depositing region to which the mixed gas is supplied at a prescribed flow rate; and, then, the glass substrate is cooled to a temperature less than 900° C. at a cooling rate of at least 10,000° C./second in the cooling region, thereby forming the silicon thin film.

8. The method of continuously forming a thin film according to claim 7, wherein the mixed gas contains DCS gas within a range from 2 mol % to 20 mol % relative to $H_2$ gas.

9. The method of continuously forming a thin film according to claim 1, wherein the glass substrate is formed of a silica glass.

10. A method of fabricating a glass substrate comprising the steps of cutting the glass substrate manufactured by the method of continuously forming a thin film according to claim 1 to a desired length; and connecting the glass substrates in a width direction thereof to form the glass substrate in a plate shape with a thin film formed thereon.

11. The method of continuously forming a thin film according to claim 1, wherein, in the step of moving the glass substrate in the film depositing region, said film depositing region includes a susceptor for maintaining the temperature thereof.

12. The method of continuously forming a thin film according to claim 1, wherein, in the step of moving the glass substrate in the film depositing region, said glass substrate is moved in the suspended state in the reaction gas so that the component of the reaction gas is deposited on both surfaces of the glass substrate.

13. The method of continuously forming a thin film according to claim 1, wherein, in the step of moving the glass substrate in the film depositing region, said film depositing region is formed of a reaction tube heated at a temperature between 1,150° C. and 1,400° C., and said reaction tube has an inner diameter in a width direction of the glass substrate, said inner diameter being 1.2 to 10 times greater than the width of the glass substrate.

14. The method of continuously forming a thin film according to claim 1, wherein, in the step of moving the glass substrate in the film depositing region, said film depositing region is formed of a reaction tube heated at a temperature between 1,150° C. and 1,400° C., and said film depositing region includes a susceptor disposed in the reaction tube.

15. The method of continuously forming a thin film according to claim 1, further comprising the steps of supplying the glass substrate from a supply drum before the glass substrate is moved into the film depositing region, and winding the glass substrate on a winding drum after the glass substrate passes through the cooling region.

* * * * *